(12) United States Patent
Yu

(10) Patent No.: US 11,574,696 B2
(45) Date of Patent: Feb. 7, 2023

(54) SEMICONDUCTOR TEST SYSTEM AND METHOD

(71) Applicant: NANYA TECHNOLOGY CORPORATION, New Taipei (TW)

(72) Inventor: Ting-Wei Yu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/228,293

(22) Filed: Apr. 12, 2021

(65) Prior Publication Data

US 2022/0328119 A1 Oct. 13, 2022

(51) Int. Cl.
*G11C 29/38* (2006.01)
*G11C 29/36* (2006.01)
*G11C 29/54* (2006.01)

(52) U.S. Cl.
CPC .............. *G11C 29/38* (2013.01); *G11C 29/36* (2013.01)

(58) Field of Classification Search
None
See application file for complete search history.

(56) References Cited

U.S. PATENT DOCUMENTS

| | | | | |
|---|---|---|---|---|
| 5,633,812 A * | 5/1997 | Allen | ............. | G01R 31/318342 714/33 |
| 9,454,457 B1 * | 9/2016 | Jan | .................. | G06F 11/3688 |
| 2003/0138765 A1 * | 7/2003 | Bowers | .................... | G09B 5/06 434/322 |
| 2003/0212924 A1 * | 11/2003 | Avvari | ................ | G06F 11/3676 714/38.13 |
| 2008/0109541 A1 * | 5/2008 | Hsu | .......................... | H04L 43/50 709/222 |
| 2010/0011252 A1 * | 1/2010 | Rivoir | .............. | G11C 29/56008 714/32 |
| 2010/0070937 A1 * | 3/2010 | Nishide | ............ | G01R 31/31835 716/136 |
| 2012/0204157 A1 * | 8/2012 | Ben-Artzi | ............... | G06F 8/751 717/136 |
| 2013/0086425 A1 * | 4/2013 | Choi | .................... | G06F 11/3636 714/32 |
| 2016/0356848 A1 * | 12/2016 | Kang | ................ | G01R 31/31919 |

* cited by examiner

*Primary Examiner* — Cynthia Britt
*Assistant Examiner* — Dipakkumar B Gandhi
(74) *Attorney, Agent, or Firm* — Muncy, Geissler, Olds & Lowe, P.C.

(57) ABSTRACT

The present disclosure provides a semiconductor test method. The semiconductor test method includes the operations of: receiving a source code written in an interpreted language; and performing, by a first test apparatus, a first test on a device under test (DUT) based on the source code. The operation of performing, by the first test apparatus, the first test on the DUT based on the source code includes the operations of: interpreting, by a processor, the source code to generate a first interpreted code; and performing the first test on the DUT according to the first interpreted code. The first test apparatus is configured to execute the first interpreted code written in a first language.

18 Claims, 19 Drawing Sheets

SEMICONDUCTOR TEST SYSTEM AND METHOD

TECHNICAL FIELD

The present disclosure relates to test system and method, and more particularly, to a semiconductor test system and a semiconductor test method.

DISCUSSION OF THE BACKGROUND

In the semiconductor industry, many characteristics of a semiconductor product needs to be test by many test devices. As time goes on, more and more kinds of test devices are built for testing the same characteristic of the semiconductor product. In general, a company may purchase several test devices to test the same characteristic of the semiconductor product in order to increase the throughput. However, the company may also purchase different kinds of test devices to test the said characteristic.

Different kinds of test devices use different program languages to execute the test function. In other word, each test device has its own compiler to compile the source code. When the test function is going to be updated, the source codes associated the test function for every test devices are modified separately. However, modifying the source code is time-consuming and easy to make mistake. Therefore, increasing the efficiency of maintaining the source code for testing the semiconductor product becomes a critical issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor test method. The semiconductor test method includes the operations of: receiving a source code written in an interpreted language; and performing, by a first test apparatus, a first test on a device under test (DUT) based on the source code. The operation of performing, by the first test apparatus, the first test on the DUT based on the source code includes the operations of interpreting, by a processor, the source code to generate a first interpreted code; and performing the first test on the DUT according to the first interpreted code. The first test apparatus is configured to execute the first interpreted code written in a first language.

In some embodiments, the first language is a first compiled language.

In some embodiments, the operation of performing the first test on the DUT according to the first interpreted code includes the operations of: compiling the first interpreted code to generate a first machine code; and executing the first machine code to perform the first test on the DUT.

In some embodiments, the semiconductor test method further includes the operations of: performing, by a second test apparatus, a second test on the DUT based on the source language. The operation of performing, by the second test apparatus, the second test on the DUT based on the source language includes the operations of: interpreting, by the processor, the source code to generate a second interpreted code; and performing the second test on the DUT according to the second interpreted code. The second test apparatus is configured to execute the second interpreted code written in a second language.

In some embodiments, the second language is a second compiled language.

In some embodiments, the operation of performing the second test on the DUT according to the second interpreted code includes the operations of: compiling the second interpreted code to generate a second machine code; and executing the second machine code to perform the second test on the DUT.

In some embodiments, the first interpreted code and the second interpreted code have the same functions.

In some embodiments, the semiconductor test method further includes the operations of: updating the first test and the second test by modifying the source code to generate an updated source code; and performing, by the first test apparatus, the first test on the DUT based on the updated source code. The operation of performing, by the first test apparatus, the first test on the DUT based on the updated source code includes the operations of: interpreting, by the processor, the updated source code to generate an updated first interpreted code, wherein the updated first interpreted code is written in the first language; and performing the first test on the DUT according to the updated first interpreted code.

In some embodiments, the semiconductor test method further includes the operations of: performing, by the second test apparatus, the second test on the DUT based on the updated source code. The operation of performing, by the second test apparatus, the second test on the DUT based on the updated source code includes the operations of interpreting, by the processor, the updated source code to generate a updated second interpreted code, wherein the updated second interpreted code is written in the second language; and performing the second test on the DUT according to the updated second interpreted code.

In some embodiments, the DUT is a dynamic random access memory (DRAM).

In some embodiments, the source code is developed based on C language, Yacc language, and Flex language.

Another aspect of the present disclosure provides a semiconductor test system. The semiconductor test system includes a DUT, a processor, and a first test apparatus. The processor is configured to receive a source code, and configured to interpret the source code to generate a first interpreted code. The first test apparatus is configured to perform a first test on the DUT based on the source code. The first test apparatus is configured to execute the first interpreted code to perform the first test. The source code is written in an interpreted language, and the first interpreted code is written in a first language.

In some embodiments, the first test apparatus is further configured to compile the first interpreted code to generate a first machine code, and configured to execute the first machine code to perform the first test on the DUT.

In some embodiments, the semiconductor test system further includes a second test apparatus configured to perform a second test on the DUT based on the source code. The second interpreted code is written in a second language, wherein the first language is different from the second language.

In some embodiments, the first language is a first compiled language, and the second language is a second compiled language.

In some embodiments, the second test apparatus is further configured to compile the second interpreted code to generate a second machine code, and configured to execute the second machine code to perform the second test on the DUT.

In some embodiments, the first interpreted code and the second interpreted code have the same functions.

In some embodiments, the processor is further configured to update the first test and the second test by modifying the source code to generate an updated source code, and configured to interpret the updated source code to generate an update first interpreted code. The updated first interpreted code is written in the first language. The first test apparatus is further configured to perform the first test on the DUT based on the updated first interpreted code.

In some embodiments, the processor is further configured to interpret the updated source code to generate an updated second interpreted code. The updated second interpreted code is written in the second language. The second test apparatus is further configured to perform the second test on the DUT based on the updated second interpreted code.

In some embodiments, the DUT is a dynamic random access memory (DRAM).

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
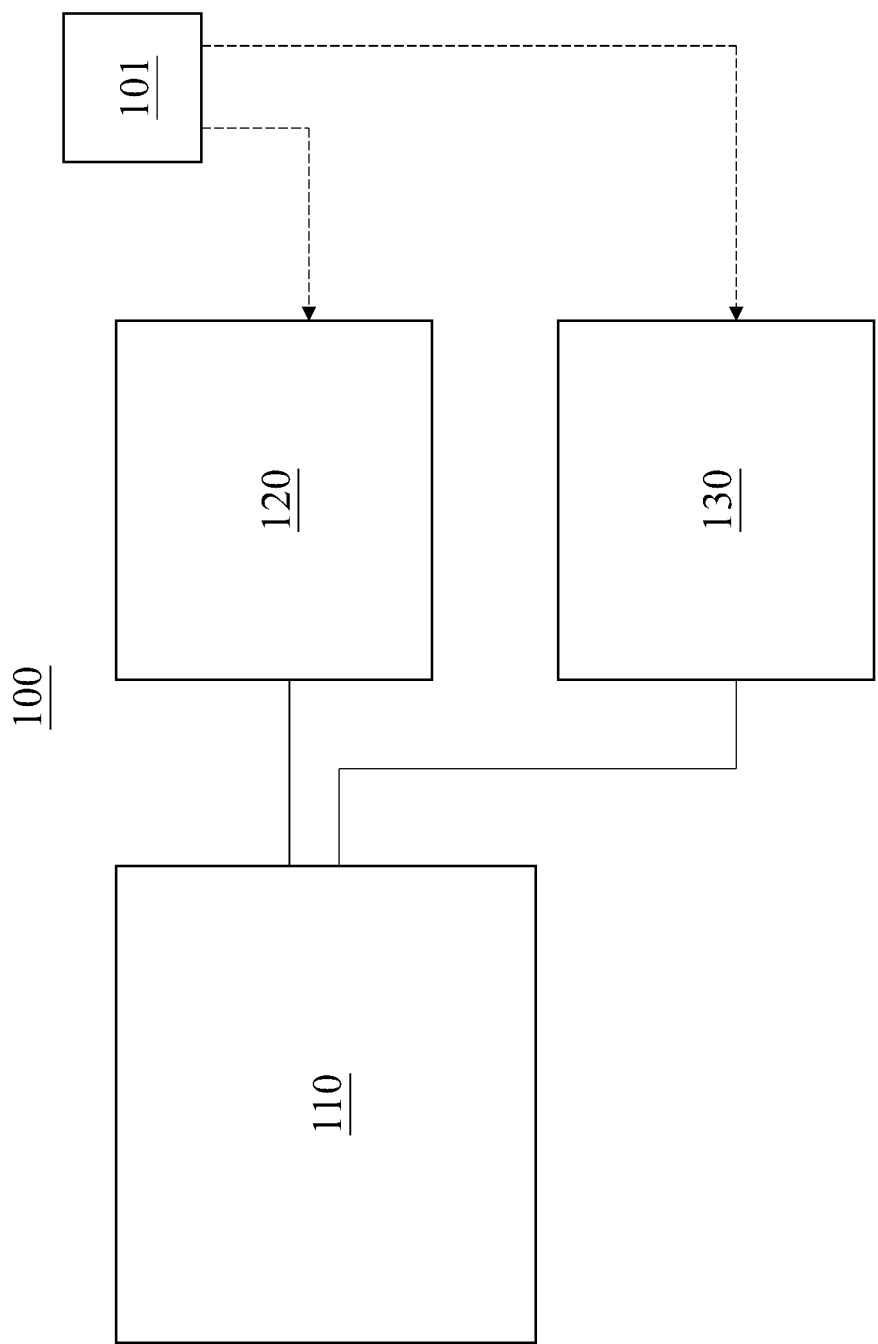
FIG. 1 is a schematic diagram of a semiconductor test system according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a semiconductor test system 100 according to some embodiments of the present disclosure. The semiconductor test system 100 is configured to test a semiconductor product. In the embodiment of FIG. 1, the semiconductor test system 100 tests a device under test (DUT) 101. In some embodiments, the DUT 101 is a memory device. In further embodiments, the DUT 101 is a dynamic random access memory (DRAM). The present disclosure does not intend to limit the DUT 101. In various embodiments, the DUT 101 is another suitable semiconductor product. For example, the DUT 101 is a semiconductor wafer, and the semiconductor test system 100 is a wafer-level test system.

The semiconductor test system 100 includes more than one apparatus to test the DUT 101. The DUT 101 are selectively tested by at least one apparatus in the semiconductor test system 100. In some embodiments, the semiconductor test system 100 includes two different apparatus for testing the same characteristic of the DUT 101, for example, testing the turn-on current of the DUT 101. Because the test functions in each of the apparatus are the same, the semiconductor test system 100 tests the DUT 101 by using only one of the apparatus.

For illustrated in FIG. 1, the semiconductor test system 100 includes a control unit 110, a first test apparatus 120, and a second test apparatus 130. The control unit 110 is coupled to the first test apparatus 120 and the second test apparatus 130.

The first test apparatus 120 is configure to receive the DUT 101 and perform a first test on the DUT 101. The second test apparatus 130 is configured to receive the DUT 101 and perform a second test on the DUT 101. The first test apparatus 120 and the second test apparatus 130 are different, however, the first test and the second test are configured to test the same characteristic of the DUT 101. In other words, the first test and the second test have the same function.

The control unit 110 is configured to control the first test apparatus 120 and/or the second test apparatus 130 to perform the first test and/or the second test on the DUT 101. When the DUT 101 is received by the first test apparatus 120, the control unit 110 controls the first test apparatus 120 to test the DUT 101. When the DUT 101 is received by the second test apparatus 130, the control unit 110 controls the second test apparatus 130 to test the DUT 101.

Figure 2:
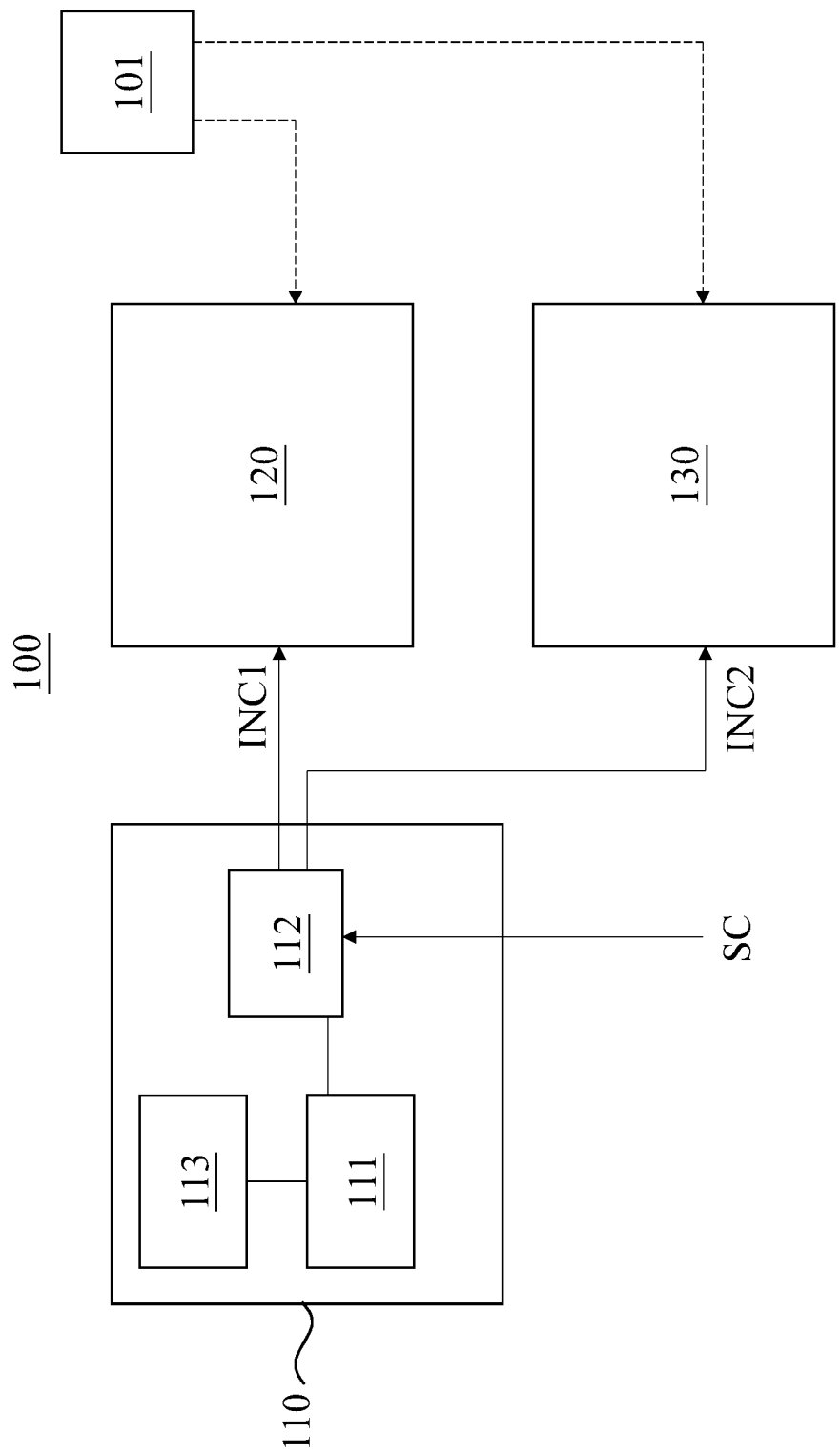
FIG. 2 is a schematic diagram of operations of a semiconductor test system according to some embodiments of the present disclosure.

Reference is made to FIG. 2. FIG. 2 is a schematic diagram of operations of the semiconductor test system 100 according to some embodiments of the present disclosure. The semiconductor test system 100 shown in FIG. 1 is the same as the semiconductor test system 100 shown in FIG. 2. The numerals designated in FIG. 2 are the same as the numeral designated in FIG. 1 to facilitate understanding.

As mentioned in the embodiments of FIG. 1, the first test apparatus 120 is different from the second test apparatus 130. More specifically, the first test apparatus 120 is configured to execute programs written in a first language, and the second test apparatus 130 is configured to execute programs written in a second language; i.e., the first test is an executable program written in the first language, and the second test is an executable program written in the second language. The first language is different from the second language. Both of the first language and the second language are compiled language. That is to say, the programs written in the first language are not executable for the second test apparatus 130, and the programs written in the second language are not executable for the first test apparatus 120.

Due to different languages, the first test apparatus 120 and the second test apparatus 130 respectively have their own complier. The first test apparatus 120 has a first complier configured to compile the programs written in the first language, and second test apparatus 130 has a second complier configured to compile the programs written in the second language.

The semiconductor test system 100 is configured to receive a source code SC, and configured to test the DUT 101 based on the source code. The source code SC is written in an interpreted language, and the source code SC includes the codes associated with the first test and the second test. More specifically, the source code SC is able to be interpreted to include the program of the first test and the program of the second test.

In some embodiments, the source code SC is developed based on the C language, the Yacc language, and the Flex language. In other embodiments, the source code SC is developed based on the C language, the Yacc language, the Flex language, or the combinations thereof.

In some embodiments, the control unit 110 is a computer. As illustrated in FIG. 2, the control unit 110 includes a processor 111 and an input and output (I/O) device 112. The I/O device 112 is coupled to the processor 111. In some embodiments, the processor 111 is a central processing unit (CPU).

The control unit 110 is configured to receive the source code SC via the I/O device 112. The processor 111 is configured to receive the source code SC through the I/O device 112. The processor 111 is further configured to interpret the source code SC.

Because the DUT 101 is only need to be tested by one of the first test apparatus 120 and the second test apparatus 130, the source code SC is interpreted by the processor 111 to generate an interpreted code associated with the first test or the second test.

When the DUT 101 is assigned to be tested by the first test apparatus 120, the processor 111 is configured to interpret the source code SC to generate a first interpreted code INC1. When the DUT 101 is assigned to be tested by the second test apparatus 130, the processor 111 is configured to interpret the source code SC to generate a second interpreted code INC2.

After the processor 111 generates the first interpreted code INC1, the first interpreted code INC1 is transmitted to the first test apparatus 120 via the I/O device 112. Similarly, after the processor 111 generates the second interpreted code INC2, the second interpreted code INC2 is transmitted to the second test apparatus 130 via the I/O device 112.

In various embodiments, both of the first test apparatus 120 and the second test apparatus 130 are assigned to test the DUT 101. In this embodiment, the processor 111 is configured to interpret the source code SC to generate the first interpreted code INC1 and the second interpreted code INC2. Then, the first interpreted code INC1 and the second interpreted code INC2 are transmitted to the first test apparatus 120 and the second test apparatus 130, respectively.

In some embodiments, the control unit 110 further includes a memory device 113. The memory device 113 is configured to store the source code SC, the first interpreted code INC1, and the second interpreted code INC2. The control unit 110 is configured to obtain the source code SC, the first interpreted code INC1, and/or the second interpreted code INC2 by accessing the memory device 113.

Figure 3:
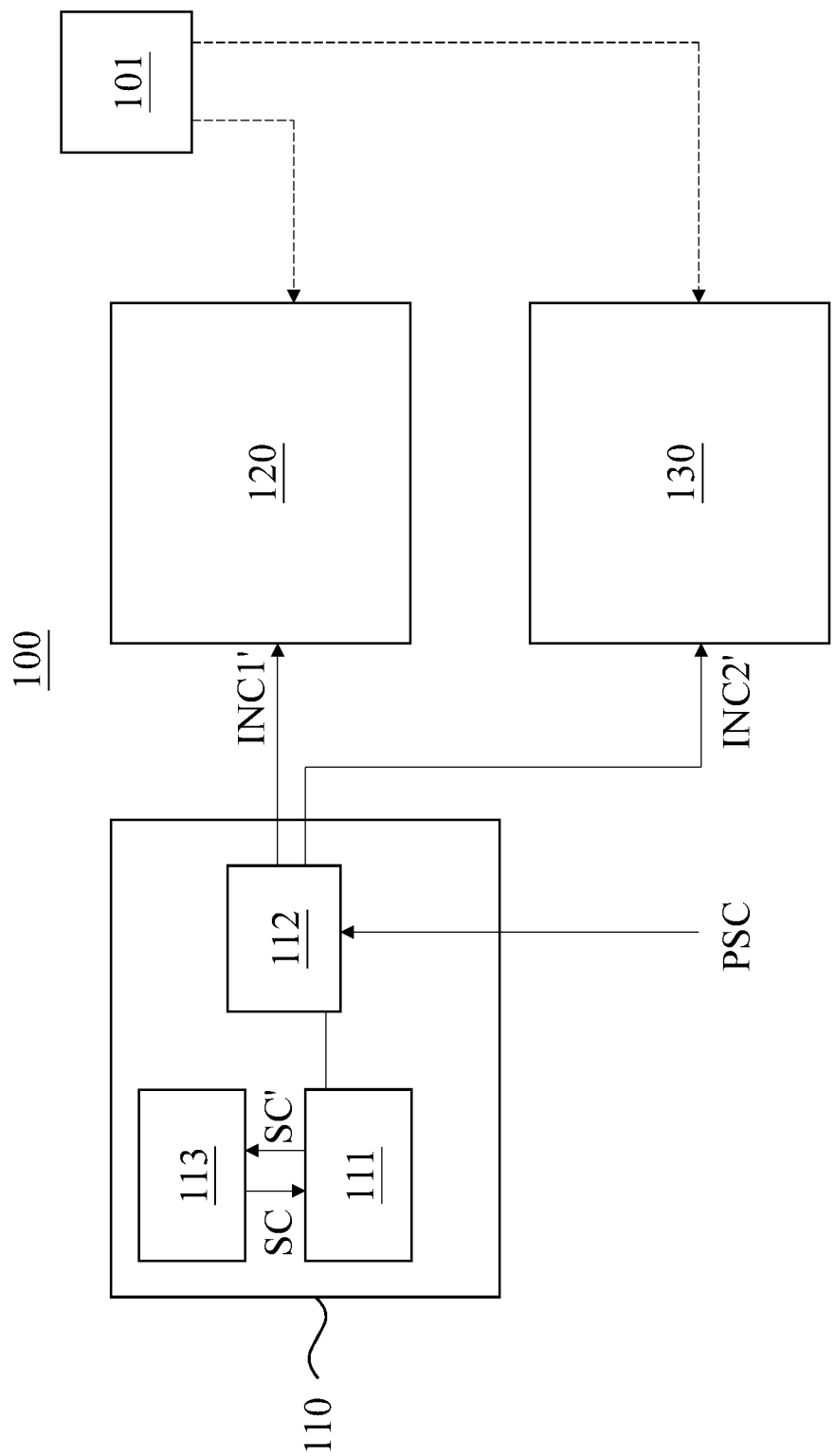
FIG. 3 is a schematic diagram of further operations of a semiconductor test system according to some embodiments of the present disclosure.

Reference is made to FIG. 3. FIG. 3 is a schematic diagram of further operations of the semiconductor test system 100 according to some embodiments of the present disclosure.

In some embodiments, the control unit 110 is configured to update the source code SC according to a patch source code PSC. The control unit 110 receives the patch source code PSC via the I/O device 112. The processor 111 receives the patch source code PSC from the I/O device 112, and obtains the source code SC from the memory device 113. The processor 111 is then configured to amend the source code SC according to the patch source code PSC. For example, there are a hundred lines of code in the source code SC, and the first line and the second line of code in the source code SC are going to be updated. The patch source PSC at least includes the first line and the second line of code which will be the first line and the second line of code in the source code SC after updating. The processor 111 amends the first line and the second line of code in the source code SC based on the first line and the second line of code in the patch source code PSC. More specifically, the processor 111 replaces the first line and the second line of code in the source code SC by the first line and the second line of code in the patch source code PSC, respectively.

After updating the source code SC, the processor 111 generates an updated course code SC'. The processor 111 is further configured to interpret the updated source code SC' to generate an updated first interpreted code INC1' and/or an updated second interpreted code INC2'. In some embodiments, the updated source code SC' is transmitted to the memory device 113 for storing.

The operations of updating the source code SC are provided for illustrative purposes. Present disclosure does not intend to limit the said operations. Various operations of updating the source code SC are within the contemplated scope of the present disclosure.

Figure 4:
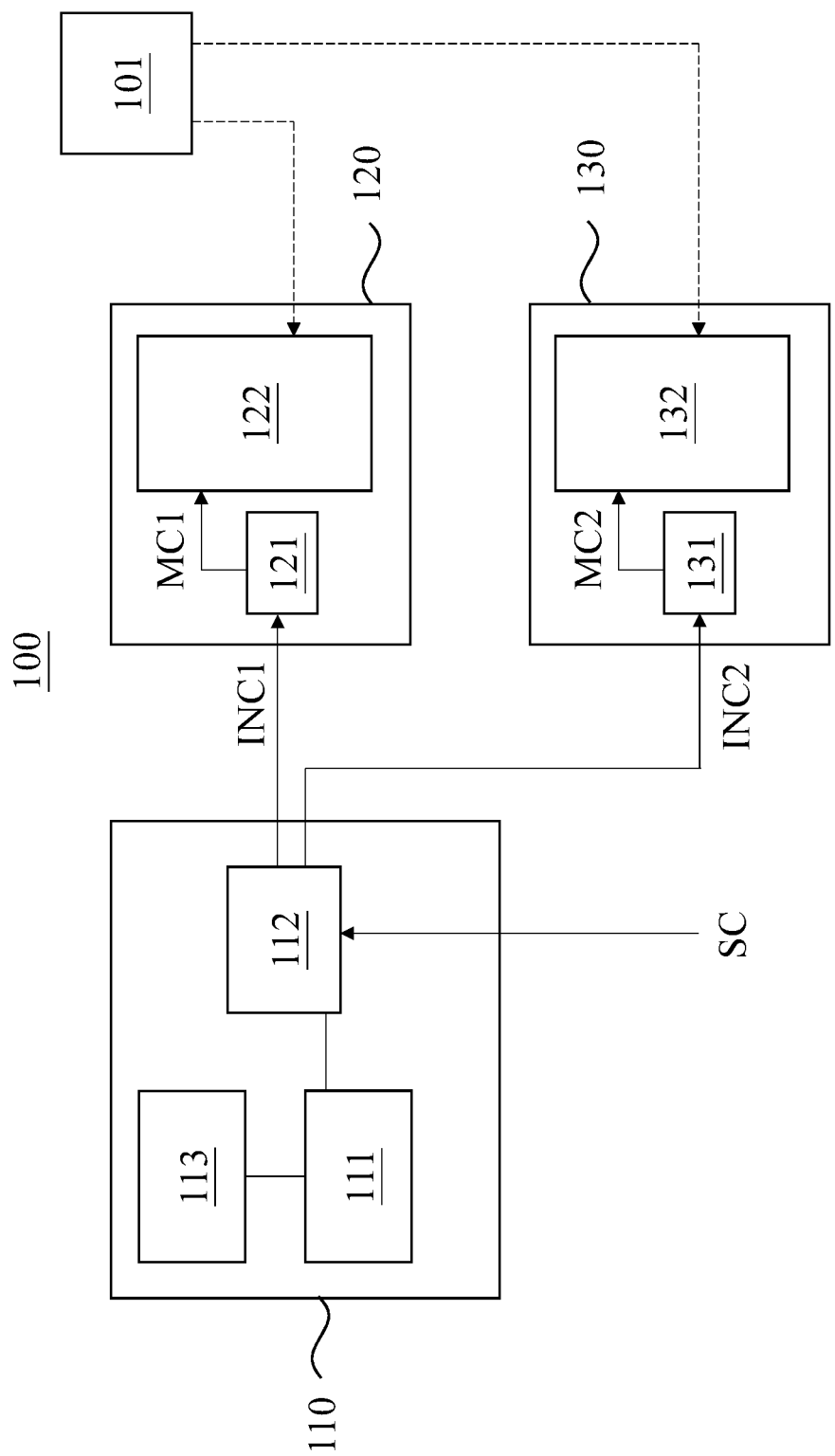
FIG. 4 is a schematic diagram of operations of a semiconductor test system according to some embodiments of the present disclosure

Reference is made to FIG. 4. FIG. 4 is a schematic diagram of operations of the semiconductor test system 100 according to some embodiments of the present disclosure.

Because the first language and the second language are compiled language, the first interpreted code INC1 and the second interpreted code INC2 interpreted by the processor 111 are the compiled language. Therefore, the first test apparatus 120 and the second test apparatus 130 are able to execute the first interpreted code INC1 and the second interpreted code INC2, respectively.

The first test apparatus 120 is configured to compile the first interpreted code INC1 to generate a first machine code MC1. The first test apparatus 120 then execute the first machine code MC1 to perform the first test on the DUT 101.

Similarly, the second test apparatus 130 is configured to compile the second interpreted code INC2 to generate a second machine code MC2. The second test apparatus 130 then execute the second machine code MC2 to perform the second test on the DUT 101.

As illustrated in FIG. 4, the first test apparatus 120 includes a first processor 121 and a first test device 122. The first processor 121 is configured to receive the first interpreted code IN1. The first processor 121 is further configured to compile the first interpreted code INC1 to generate the first machine code MC1. The first test device 122 is configured to receive the DUT 101 and execute the first machine code MC1 to perform the first test on the DUT 101.

Similarly, the second test apparatus 130 includes a second processor 131 and a second test device 132. The second processor 131 is configured to receive the second interpreted code IN2. The second processor 131 is further configured to compile the second interpreted code INC2 to generate the second machine code MC2. The second test device 132 is configured to receive the DUT 101 and execute the second machine code MC2 to perform the second test on the DUT 101.

Figure 5:
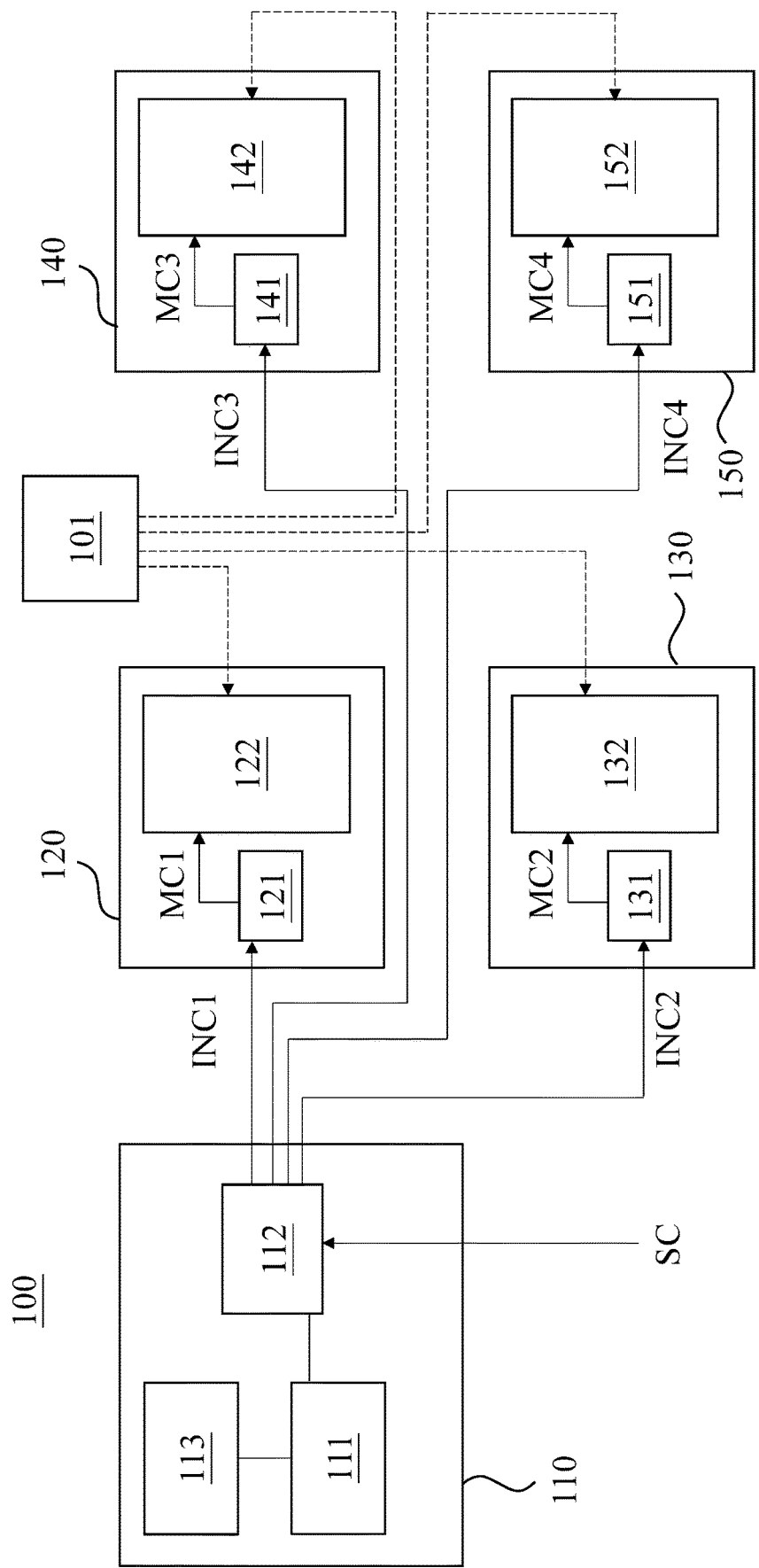
FIG. 5 is a schematic diagram of a semiconductor test system according to other embodiments of the present disclosure.

In some embodiments, the semiconductor test system 100 is further configured to test another characteristic of the DUT 101, thereby, the semiconductor test system 100 further includes other test apparatus to test said another characteristic of the DUT 101. Reference is made to FIG. 5. FIG. 5 is a schematic diagram of the semiconductor test system 100 according to other embodiments of the present disclosure. The semiconductor test system 100 further includes a third test apparatus 140 and a fourth test apparatus 150. The third test apparatus 140 and the fourth test apparatus 150 are coupled to the control unit 110.

After the DUT 101 is tested by the first test apparatus 120 or the second test apparatus 130, the DUT 101 is further selectively tested by the third test apparatus 140 or the fourth test apparatus 150.

The third test apparatus 140 is configure to receive the DUT 101 and perform a third test on the DUT 101. The fourth test apparatus 150 is configured to receive the DUT 101 and perform a fourth test on the DUT 101. The third test apparatus 140 and the fourth test apparatus 150 are different, however, the third test and the fourth test are configured to test the same characteristic of the DUT 101. In other words, the third test and the fourth test have the same function.

The control unit 110 is further configured to control the third test apparatus 140 and/or the fourth test apparatus 150 to perform the third test and/or the fourth test on the DUT 101. When the DUT 101 is received by the third test apparatus 120 after the first test or the second test, the control unit 110 controls the third test apparatus 140 to test the DUT 101. When the DUT 101 is received by the fourth test apparatus 150 after the first test or the second test, the control unit 110 controls the fourth test apparatus 150 to test the DUT 101.

The third test apparatus 140 is configured to execute programs written in a third language, and the fourth test apparatus 150 is configured to execute programs written in a fourth language; i.e., the third test is an executable program written in the third language, and the fourth test is an executable program written in the fourth language. The third language is different from the fourth language. Both of the third language and the fourth language are compiled language. That is to say, the programs written in the third language are not executable for the fourth test apparatus 150, and the programs written in the fourth language are not executable for the third test apparatus 140.

In some embodiments, the first language is the same as the third language, and the second language is the same as the fourth language.

Due to different languages, the third test apparatus 140 and the fourth test apparatus 150 respectively have their own complier. The third test apparatus 140 has a third complier configured to compile the programs written in the third language, and fourth test apparatus 150 has a fourth complier configured to compile the programs written in the fourth language.

In the embodiment of FIG. 5, the source code SC further includes the codes associated with the third test and the fourth test. More specifically, the source code SC is able to be interpreted to include the program of the third test and the program of the fourth test.

Because the DUT 101 is only need to be tested by one of the third test apparatus 140 and the fourth test apparatus 150, the source code SC is interpreted by the processor 111 to generate the interpreted code associated with the third test or the fourth test.

When the DUT 101 is assigned to be tested by the third test apparatus 140, the processor 111 is configured to interpret the source code SC to generate a third interpreted code INC3. When the DUT 101 is assigned to be tested by the fourth test apparatus 150, the processor 111 is configured to interpret the source code SC to generate a fourth interpreted code INC4.

After the processor 111 generates the third interpreted code INC3, the third interpreted code INC3 is transmitted to the third test apparatus 140 via the I/O device 112. Similarly, after the processor 111 generates the fourth interpreted code INC4, the fourth interpreted code INC4 is transmitted to the fourth test apparatus 150 via the I/O device 112.

In various embodiments, both of the third test apparatus 140 and the fourth test apparatus 150 are assigned to test the DUT 101. In this embodiment, the processor 111 is configured to interpret the source code SC to generate the third interpreted code INC3 and the fourth interpreted code INC4. Then, the third interpreted code INC3 and the fourth interpreted code INC4 are transmitted to the third test apparatus 140 and the fourth test apparatus 150, respectively.

The memory device 113 is further configured to store the third interpreted code INC3 and the fourth interpreted code INC4. The control unit 110 is further configured to obtain the third interpreted code INC3 and/or the fourth interpreted code INC4 by accessing the memory device 113.

Because the third language and the fourth language are compiled language, the third interpreted code INC3 and the fourth interpreted code INC4 interpreted by the processor 111 are the compiled language. Therefore, the third test apparatus 140 and the fourth test apparatus 140 are able to execute the third interpreted code INC3 and the fourth interpreted code INC4, respectively.

The third test apparatus 140 is configured to compile the third interpreted code INC3 to generate a third machine code MC3. The third test apparatus 140 then execute the third machine code MC3 to perform the third test on the DUT 101.

Similarly, the fourth test apparatus 150 is configured to compile the fourth interpreted code INC4 to generate a fourth machine code MC4. The fourth test apparatus 150 then execute the fourth machine code MC4 to perform the fourth test on the DUT 101.

As illustrated in FIG. 5, the third test apparatus 140 includes a third processor 141 and a third test device 142. The third processor 141 is configured to receive the third interpreted code INC3. The third processor 141 is further configured to compile the third interpreted code INC3 to generate the third machine code MC3. The third test device 142 is configured to receive the DUT 101 and execute the third machine code MC3 to perform the third test on the DUT 101.

Similarly, the fourth test apparatus 150 includes a fourth processor 151 and a fourth test device 152. The fourth processor 151 is configured to receive the fourth interpreted code INC4. The fourth processor 151 is further configured to compile the fourth interpreted code INC4 to generate the fourth machine code MC4. The fourth test device 152 is configured to receive the DUT 101 and execute the fourth machine code MC4 to perform the fourth test on the DUT 101.

Figure 6:
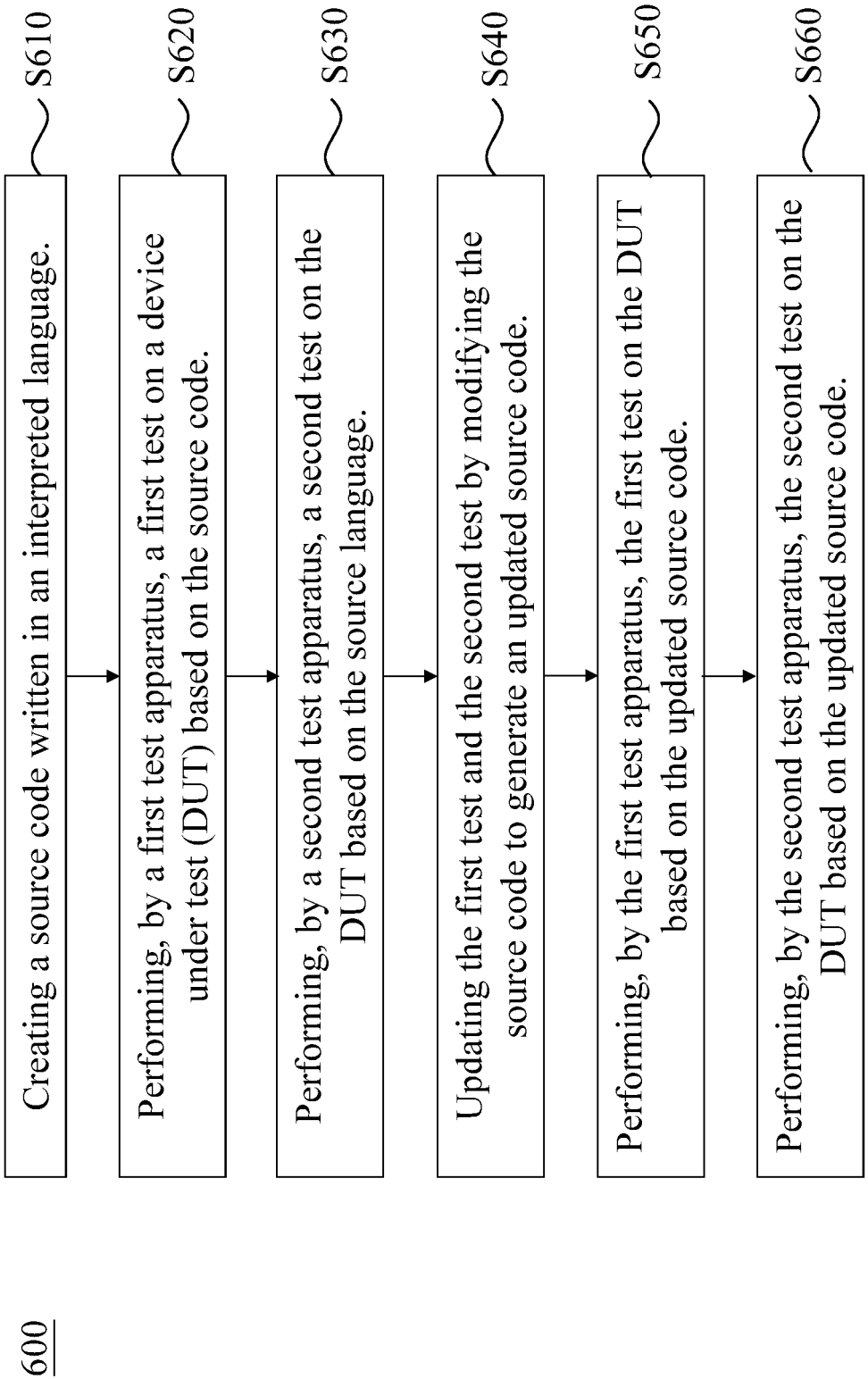
FIG. 6 is a flowchart of a semiconductor test method 600 according to some embodiments of the present disclosure.

Reference is made to FIG. 6. FIG. 6 is a flowchart of a semiconductor test method 600 according to some embodiments of the present disclosure. The semiconductor test method 600 is configured to test a semiconductor device, such as the DUT 101 shown in FIG. 1 to FIG. 5. In some embodiments, the semiconductor test system 100 uses the semiconductor test method 600 to fulfill the operations of testing the DUT 101 as described in FIG. 1 to FIG. 5. To facilitate understanding, the descriptions about the semiconductor test method 600 use the same numerals shown in FIG. 1 to FIG. 5.

The semiconductor test method 600 includes an operation S610, an operation S620, an operation S630, an operation S640, an operation S650, and an operation S660.

In operation S610, the source code SC is received, in which the source code SC is written in the interpreted language. In some embodiments, the source code SC is received by the control unit 110 of the semiconductor test system 100.

In operation S620, the first test is performed on the DUT 101 based on the source code SC. In some embodiments, the first test is performed by the first test apparatus 120 of the semiconductor test system 100, in which the first test apparatus 120 is configured to execute the program written in the first language. In some embodiments, the first language is the first compiled language.

In operation S630, the second test is performed on the DUT 101 based on the source code SC. In some embodiments, the second test is performed by the second test apparatus 130 of the semiconductor test system 100, in which the second test apparatus 130 is configured to execute the program written in the second compiled language. In some embodiments, the second language is the second compiled language.

In some embodiments, the first language is different from the second language

In operation S640, the first test and the second test are updated by modifying the source code SC, and the updated source code SC' is generated according to the source code being modified. In some embodiments, the source code SC is modified by the processor 111 of the control unit 110 of the semiconductor test system 100. Furthermore, the updated source code SC' is generated by the processor 111.

In operation S650, the first test being updated is performed on the DUT 101 based on the updated source code SC'. In some embodiments, the first test being updated is performed by the first test apparatus 120.

In operation S660, the second test being updated is performed on the DUT 101 based on the updated source code SC'. In some embodiments, the second test being updated is performed by the second test apparatus 130.

Figure 7:
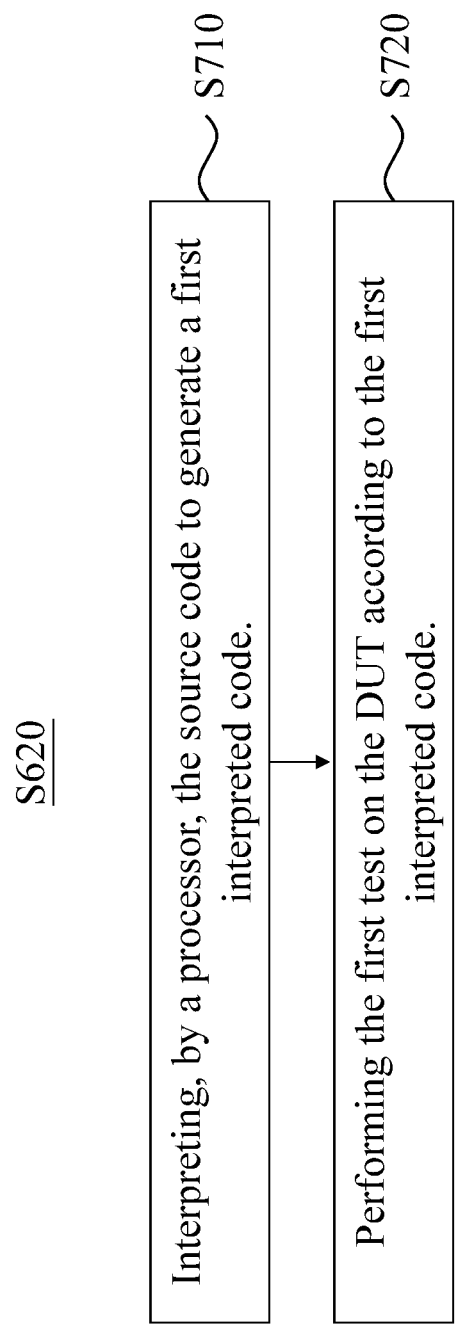
FIG. 7 is a detailed flowchart of part of the semiconductor test method according to some embodiments of the present disclosure.

Reference is made to FIG. 7. FIG. 7 is a detailed flowchart of part of the semiconductor test method 600 according to some embodiments of the present disclosure. More particularly, FIG. 7 illustrates a detailed flowchart of the operation S620 shown in FIG. 6.

As shown in FIG. 7, the operation S620 includes an operation S710 and an operation S720.

In operation S710, the source code SC is interpreted to generate the first interpreted code INC1. In some embodiments, the source code SC is interpreted by the processor 111, and the first interpreted code INC1 is generated by the processor 111.

In operation S720, the first test is performed on the DUT 101 according to the first interpreted code INC1. In some embodiments, the first test is performed by the first test apparatus 120.

Figure 8:
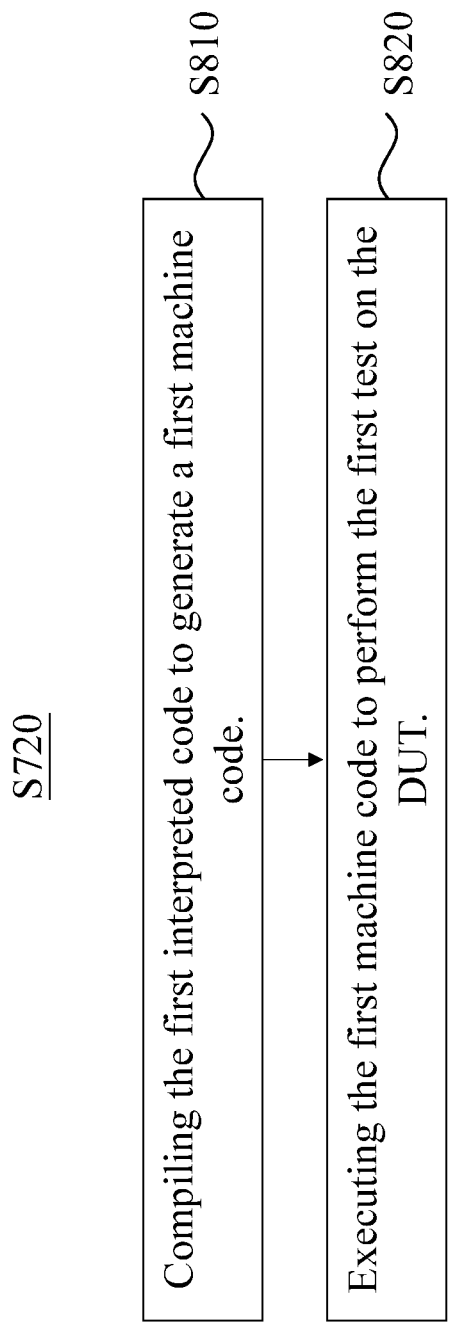
FIG. 8 is a detailed flowchart of part of the semiconductor test method according to some embodiments of the present disclosure.

Reference is made to FIG. 8. FIG. 8 is a detailed flowchart of part of the semiconductor test method 600 according to some embodiments of the present disclosure. More particularly, FIG. 8 illustrates a detailed flowchart of the operation S720 shown in FIG. 7.

As shown in FIG. 8, the operation S720 includes an operation S810 and an operation S820.

In operation S810, the first interpreted code INC1 is compiled to generate the first machine code MC1. In some embodiments, the first interpreted code INC1 is compiled by the first processor 121 of the first test apparatus 120, and the first machine code MC1 is generated by the first processor 121.

In operation S820, the first machine code MC1 is executed to perform the first test on the DUT 101. In some embodiments, the first machine code MC1 is executed by the first test device 122 of the first test apparatus 120 to perform the first test on the DUT 101.

Figure 9:
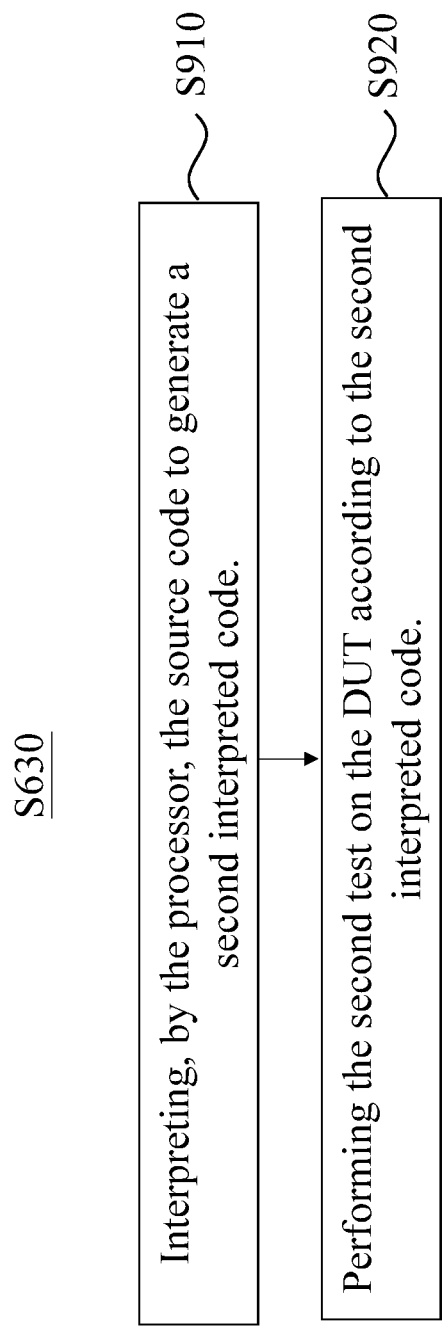
FIG. 9 is a detailed flowchart of part of the semiconductor test method according to some embodiments of the present disclosure.

Reference is made to FIG. 9. FIG. 9 is a detailed flowchart of part of the semiconductor test method 600 according to some embodiments of the present disclosure. More particularly, FIG. 9 illustrates a detailed flowchart of the operation S630 shown in FIG. 6.

As shown in FIG. 9, the operation S630 includes an operation S910 and an operation S920.

In operation S910, the source code SC is interpreted to generate the second interpreted code INC2. In some embodiments, the source code SC is interpreted by the processor 111, and the second interpreted code INC2 is generated by the processor 111.

In operation S920, the second test is performed on the DUT 101 according to the second interpreted code INC2. In some embodiments, the second test is performed by the second test apparatus 130.

Figure 10:
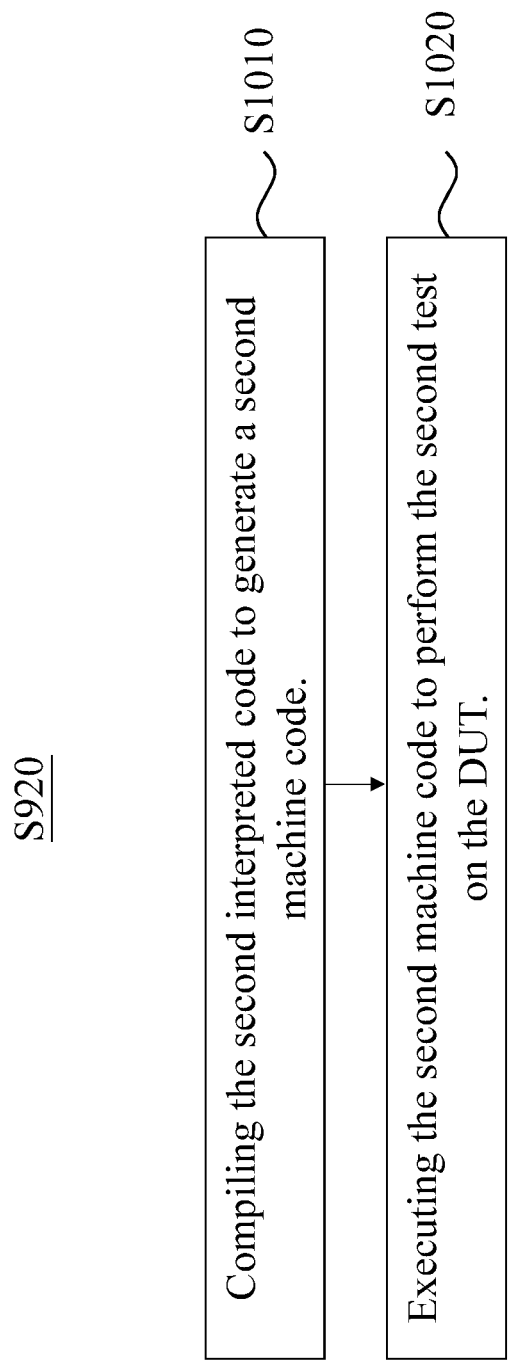
FIG. 10 is a detailed flowchart of part of the semiconductor test method according to some embodiments of the present disclosure.

Reference is made to FIG. 10. FIG. 10 is a detailed flowchart of part of the semiconductor test method 600 according to some embodiments of the present disclosure. More particularly, FIG. 10 illustrates a detailed flowchart of the operation S920 shown in FIG. 9.

As shown in FIG. 10, the operation S920 includes an operation S1010 and an operation S1020.

In operation S1010, the second interpreted code INC2 is compiled to generate the second machine code MC2. In some embodiments, the second interpreted code INC2 is compiled by the second processor 131 of the second test apparatus 130, and the second machine code MC2 is generated by the second processor 131.

In operation S1020, the second machine code MC2 is executed to perform the second test on the DUT 101. In some embodiments, the second machine code MC2 is executed by the second test device 132 of the second test apparatus 130 to perform the second test on the DUT 101.

In some embodiments, the first test and the second test performed in the semiconductor test method 600 have the same function.

Figure 11:
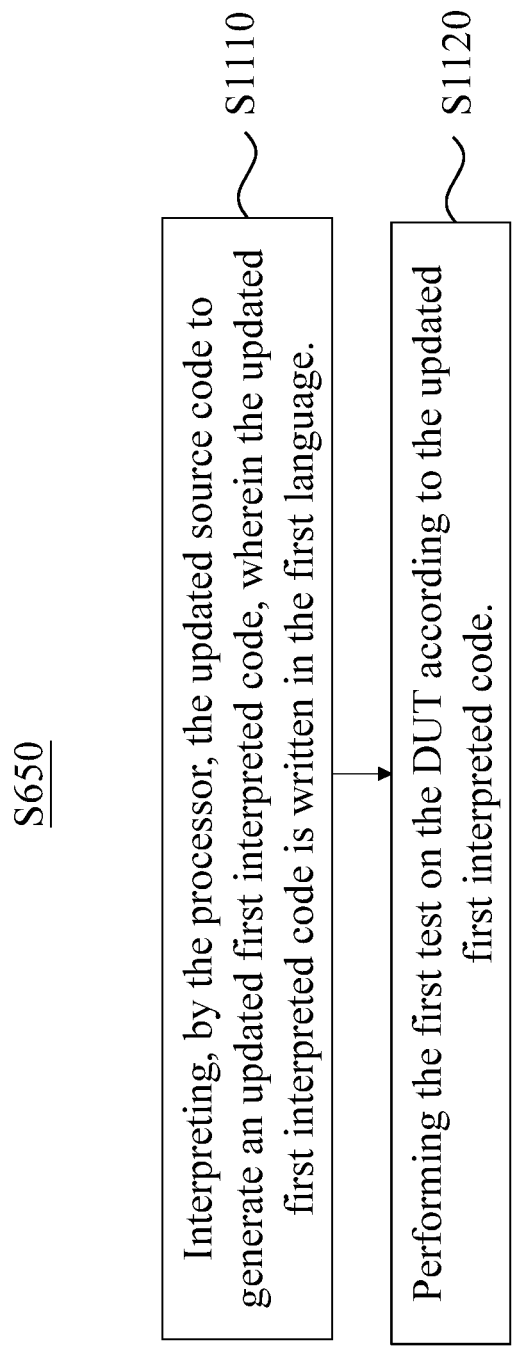
FIG. 11 is a detailed flowchart of part of the semiconductor test method according to some embodiments of the present disclosure.

Reference is made to FIG. 11. FIG. 11 is a detailed flowchart of part of the semiconductor test method 600 according to some embodiments of the present disclosure. More particularly, FIG. 11 illustrates a detailed flowchart of the operation S650 shown in FIG. 6.

As shown in FIG. 11, the operation S650 includes an operation S110 and an operation S1120.

In operation S1110, the updated source code SC' is interpreted to generate an updated first interpreted code INC1', in which the undated first interpreted code INC1' is written in the first language. In some embodiments, the updated source code SC' is interpreted by the processor 111 to generate the updated first interpreted code INC1'.

In operation S1120, the first test is performed on the DUT 101 according to the updated first interpreted code INC1'. In some embodiments, the first test is performed by the first test apparatus 120.

Figure 12:
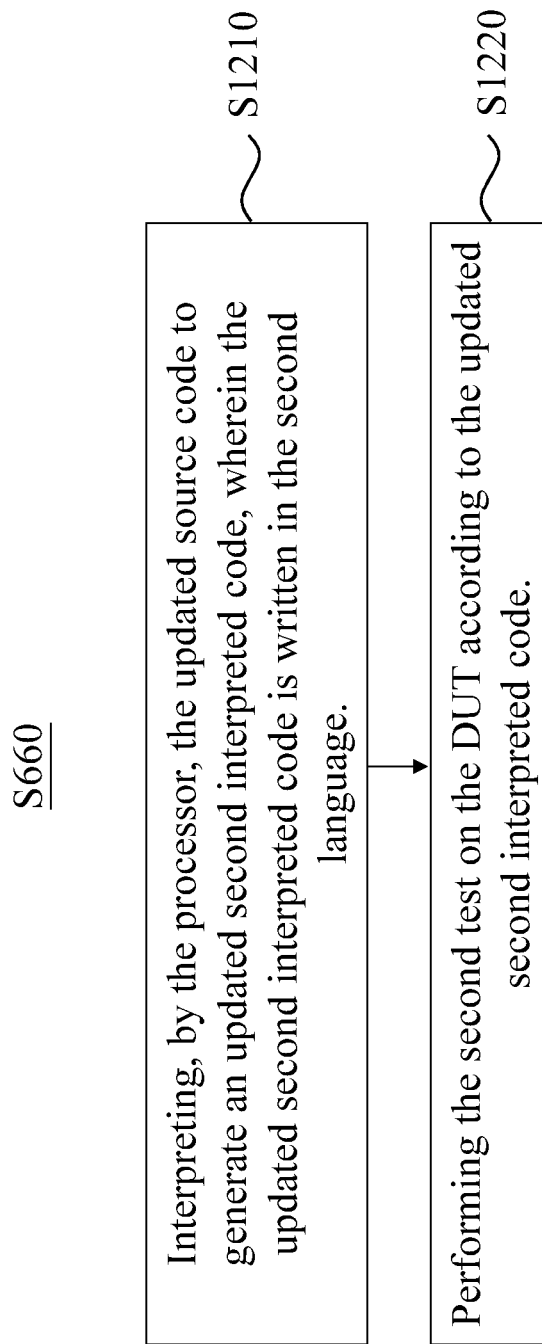
FIG. 12 is a detailed flowchart of part of the semiconductor test method according to some embodiments of the present disclosure.

Reference is made to FIG. 12. FIG. 12 is a detailed flowchart of part of the semiconductor test method 600 according to some embodiments of the present disclosure. More particularly, FIG. 12 illustrates a detailed flowchart of the operation S660 shown in FIG. 6.

As shown in FIG. 12, the operation S660 includes an operation S1210 and an operation S1220.

In operation S1210, the updated source code SC' is interpreted to generate an updated second interpreted code INC2', in which the undated second interpreted code INC2' is written in the second language. In some embodiments, the updated source code SC' is interpreted by the processor 111 to generate the updated second interpreted code INC2'.

In operation S1220, the second test is performed on the DUT 101 according to the updated second interpreted code INC2'. In some embodiments, the second test is performed by the second test apparatus 130.

Figure 13:
FIG. 13 is a detailed flowchart of part of the semiconductor test method according to some embodiments of the present disclosure.

Reference is made to FIG. 13. FIG. 13 is a detailed flowchart of part of the semiconductor test method 600 according to some embodiments of the present disclosure. More particularly, FIG. 13 illustrates a detailed flowchart of the operation S1120 shown in FIG. 11.

As shown in FIG. 13, the operation S1120 includes an operation S1310 and an operation S1320.

In operation S1310, the updated first interpreted code INC1' is compiled to generate an updated first machine code. In some embodiments, the updated first interpreted code INC1' is compiled by the first processor 121 of the first test apparatus 120, and the updated first machine code is generated by the first processor 121.

In operation S1320, the updated first machine code is executed to perform the first test on the DUT 101. In some embodiments, the updated first machine code is executed by the first test device 122 of the first test apparatus 120 to perform the first test on the DUT 101.

Figure 14:
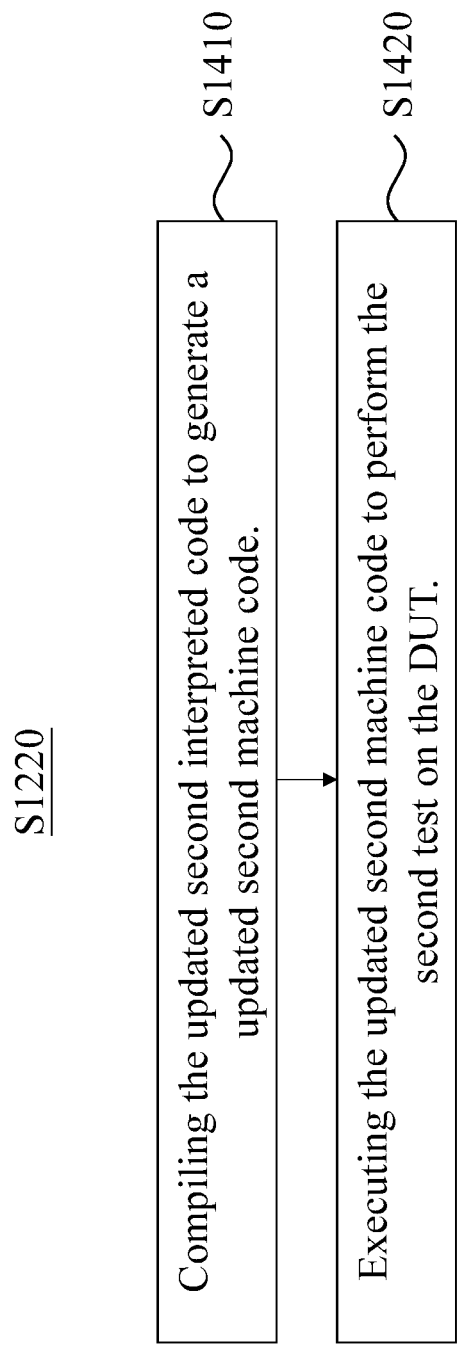
FIG. 14 is a detailed flowchart of part of the semiconductor test method according to some embodiments of the present disclosure.

Reference is made to FIG. 14. FIG. 14 is a detailed flowchart of part of the semiconductor test method 600 according to some embodiments of the present disclosure. More particularly, FIG. 14 illustrates a detailed flowchart of the operation S1220 shown in FIG. 12.

As shown in FIG. 14, the operation S1220 includes an operation S1410 and an operation S1420.

In operation S1410, the updated second interpreted code INC2' is compiled to generate an updated second machine code. In some embodiments, the updated second interpreted code INC2' is compiled by the second processor 131 of the second test apparatus 130, and the updated second machine code is generated by the second processor 131.

In operation S1420, the updated second machine code is executed to perform the second test on the DUT 101. In some embodiments, the updated second machine code is executed by the second test device 132 of the second test apparatus 130 to perform the second test on the DUT 101.

Figure 15:
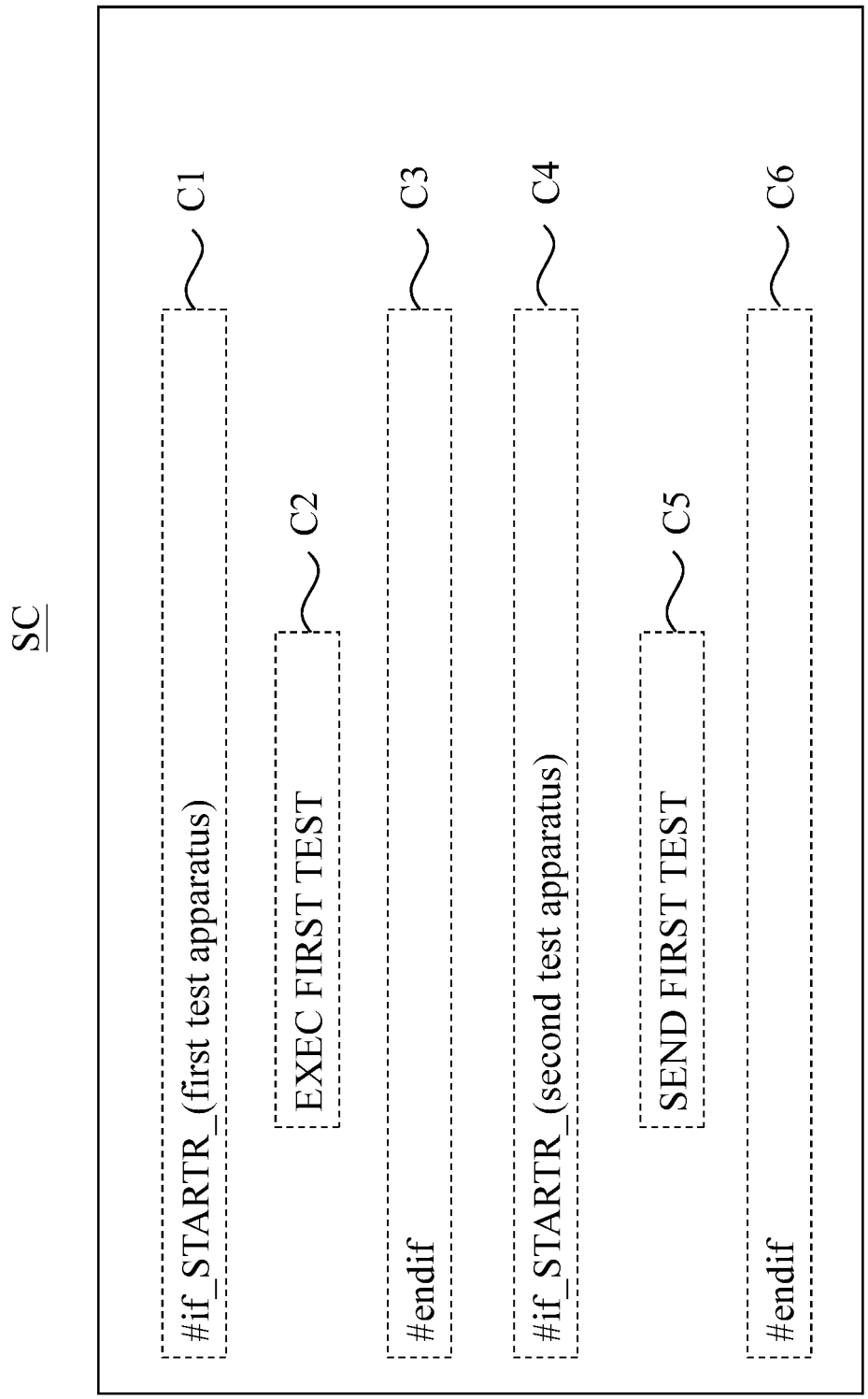
FIG. 15 is a schematic diagram of a source code according to some embodiments of the present disclosure.
Figure 16:
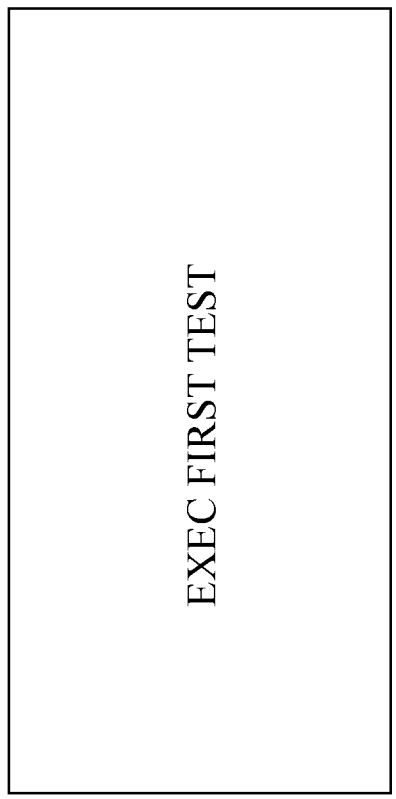
FIG. 16 is a schematic diagram of a first interpreted code according to some embodiments of the present disclosure.
Figure 17:
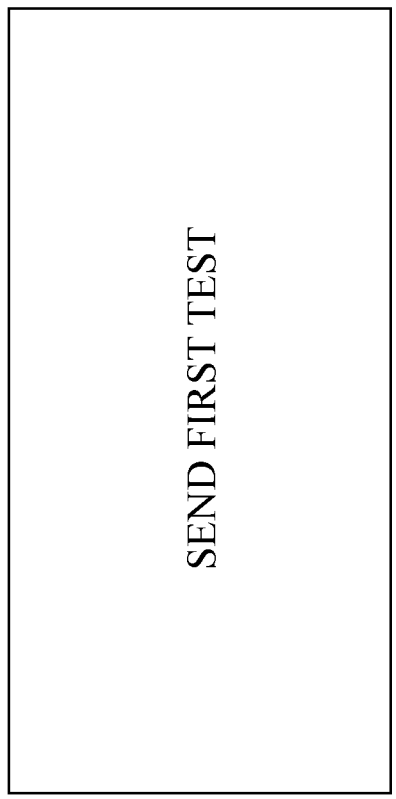
FIG. 17 is a schematic diagram of a second interpreted code according to some embodiments of the present disclosure.

Reference is made to FIG. 15, FIG. 16, and FIG. 17. FIG. 15 is a schematic diagram of the source code SC according to some embodiments of the present disclosure. FIG. 16 is a schematic diagram of the first interpreted code INC1 according to some embodiments of the present disclosure. FIG. 17 is a schematic diagram of the second interpreted code INC2 according to some embodiments of the present disclosure.

Because the source code SC includes the codes associated with the first test and the second test, the processor 111 is configured to determine which part of the source code SC being interpreted.

As illustrated in FIG. 15, the source code SC includes a code C1, a code C2, a code C3, a code C4, a code C5, and a code C6. The code C1 is configured to indicate that the portion of the source code SC between the code C1 and the code C3 (i.e., the code C2 in the embodiment in FIG. 0.15) is output to generate the first interpreted code INC1 when the first test apparatus 120 is assigned to test the DUT 101. The code C4 is configured to indicate that the portion of the source code SC between the code C4 and the code C6 (i.e., the code C5 in the embodiment in FIG. 15) is output to generate the second interpreted code INC2 when the second test apparatus 120 is assigned to test the DUT 101.

When the first test apparatus 120 is assigned to test the DUT 101, the processor 111 interprets the portion of the source code SC associated with the first test to generate the first interpreted code INC1. More specifically, the processor 111 reads the code C1 and outputs the code C2 according to the code C1 and the code C3 to generate the first interpreted code INC1 as shown in FIG. 16. In addition, because the second test apparatus 130 is not assigned, when the processor 111 reads the code C4, the processor 111 does not output the code C5 according to the code C4 and the code C6.

In contrast, when the second test apparatus 120 is assigned to test the DUT 101, the processor 111 interprets the portion of the source code SC associated with the second test to generate the second interpreted code INC2. More specifically, the processor 111 reads the code C4 and outputs the code C5 according to the code C4 and the code C4 to generate the second interpreted code INC2 as shown in FIG. 17. In addition, because the first test apparatus 130 is not assigned, when the processor 111 reads the code C1, the processor 111 does not output the code C2 according to the code C1 and the code C3.

Figure 18:
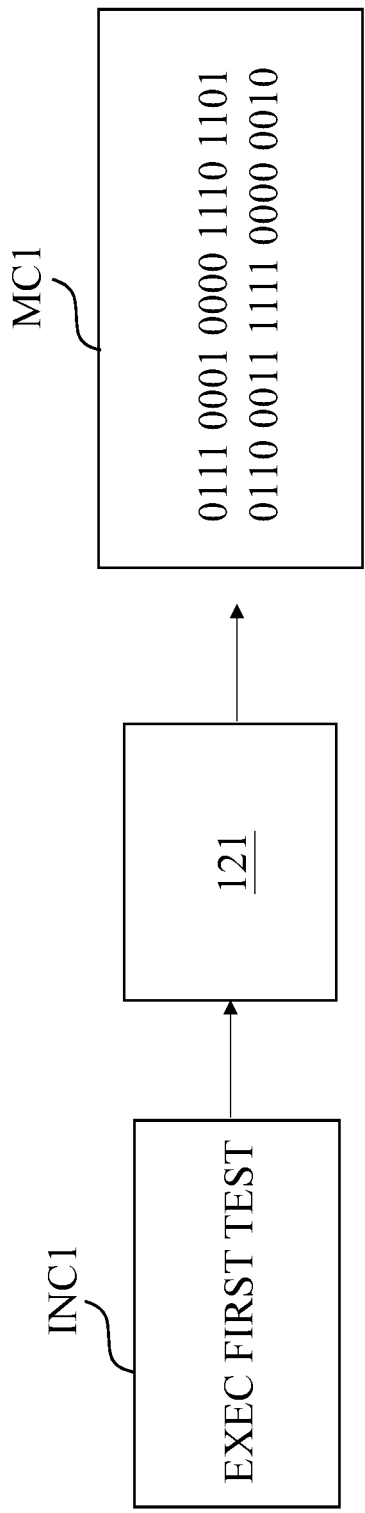
FIG. 18 is a schematic diagram of a first machine code according to some embodiments of the present disclosure.
Figure 19:
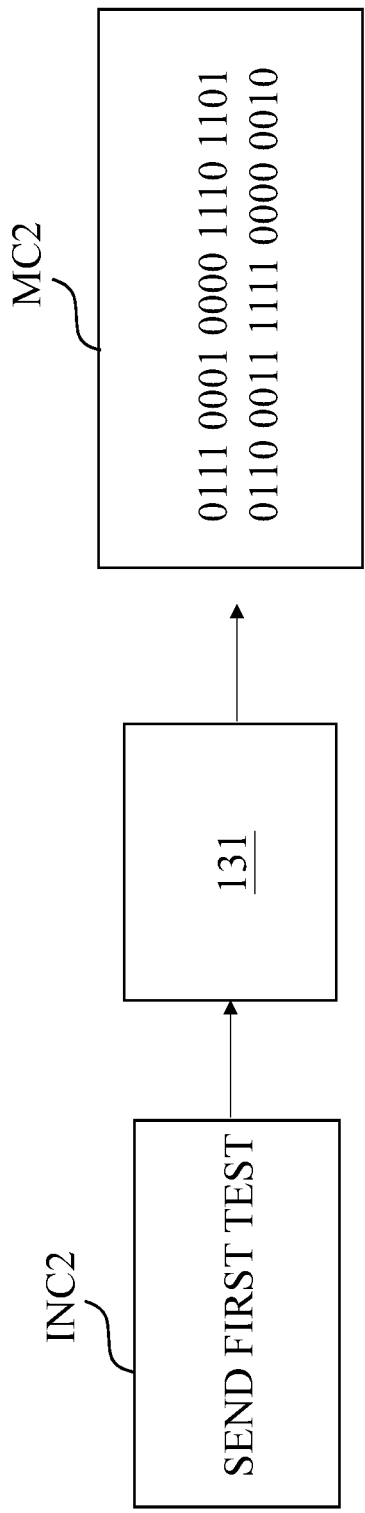
FIG. 19 is a schematic diagram of a second machine code according to some embodiments of the present disclosure.

Reference is made to FIG. 18 and FIG. 19. FIG. 18 and FIG. 19 are the schematic diagrams of the first machine code MC1 and the second machine code MC2, respectively, according to some embodiments of the present disclosure.

After the first interpreted code INC1 is generated, the first processor 121 compiles the first interpreted code INC1 to generate the first machine code MC1 as shown in FIG. 18. On the other hand, after the second interpreted code INC2 is generated, the second processor 131 compiles the second interpreted code INC2 to generate the second machine code MC2 as shown in FIG. 19

It is noted that the first machine code MC1 is the same as the second machine code MC2 because the first test and the second test have the same function.

The source code SC, the first interpreted code INC1, the second interpreted code INC2, the first machine code MC1, and the second machine code MC2 shown in FIG. 15 to FIG. 19 are provided for illustrative purposes. However, the present disclosure does not intend to limit. Various source codes SC, first interpreted codes INC1, second interpreted codes INC2, first machine codes MC1, and second machine codes MC2 are within the contemplated scope of the present disclosure.

One aspect of the present disclosure provides a semiconductor test method. The semiconductor test method includes the operations of: receiving a source code written in an interpreted language; and performing, by a first test apparatus, a first test on a device under test DUT based on the source code. The operation of performing, by the first test apparatus, the first test on the DUT based on the source code includes the operations of interpreting, by a processor, the source code to generate a first interpreted code; and performing the first test on the DUT according to the first interpreted code. The first test apparatus is configured to execute the first interpreted code written in a first language Another aspect of the present disclosure provides a semiconductor test system. The semiconductor test system includes a DUT, a processor, and a first test apparatus. The processor is configured to receive a source code, and configured to interpret the source code to generate a first interpreted code. The first test apparatus is configured to perform a first test on the DUT based on the source code. The first test apparatus is configured to execute the first interpreted code to perform the first test. The source code is written in an interpreted language, and the first interpreted code is written in a first language.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor test method, comprising:
   receiving a source code written in an interpreted language; and
   performing, by a first test apparatus, a first test on a device under test (DUT) based on the source code, comprising:
   interpreting, by a processor, the source code to generate a first interpreted code; and
   performing the first test on the DUT according to the first interpreted code interpreted from the source code;
   performing, by a second test apparatus, a second test on the DUT based on the source code, comprising:
   interpreting, by the processor, the source code to generate a second interpreted code; and
   performing the second test on the DUT according to the second interpreted code interpreted from the source code;
   wherein the first test apparatus only executes the first interpreted code written in a first languages;
   wherein the second test apparatus only executes the second interpreted code written in a second language different from the first language,
   wherein the first interpreted code written in the first language is compiled by a first compiler of the first test apparatus and the second interpreted code written in the second language is compiled by a second compiler of the second test apparatus.

2. The semiconductor test method of claim 1, wherein the first language is a first compiled language.

3. The semiconductor test method of claim 2, wherein performing the first test on the DUT according to the first interpreted code interpreted from the source code comprises:
   compiling the first interpreted code to generate a first machine code; and
   executing the first machine code to perform the first test on the DUT.

4. The semiconductor test method of claim 1, wherein the second language is a second compiled language.

5. The semiconductor test method of claim 1, wherein performing the second test on the DUT according to the second interpreted code interpreted from the source code comprises:
   compiling the second interpreted code to generate a second machine code; and
   executing the second machine code to perform the second test on the DUT.

6. The semiconductor test method of claim 5, wherein the first interpreted code and the second interpreted code have the same functions.

7. The semiconductor test method of claim 1, further comprising:
   updating the first test and the second test by modifying the source code to generate an updated source code; and
   performing, by the first test apparatus, the first test on the DUT based on the updated source code, comprising:
   interpreting, by the processor, the updated source code to generate an updated first interpreted code, wherein the updated first interpreted code is written in the first language; and
   performing the first test on the DUT according to the updated first interpreted code.

8. The semiconductor test method of claim 7, further comprising:
   performing, by the second test apparatus, the second test on the DUT based on the updated source code, comprising:
      interpreting, by the processor, the updated source code to generate an updated second interpreted code, wherein the updated second interpreted code is written in the second language; and
      performing the second test on the DUT according to the updated second interpreted code.

9. The semiconductor test method of claim 1, wherein the DUT is a dynamic random access memory (DRAM).

10. The semiconductor test method of claim 1, wherein the source code is developed based on C language, Yacc language, and Flex language.

11. A semiconductor test system, comprising:
   a device under test (DUT);
   a processor, configured to receive a source code, and configured to interpret the source code to generate a first interpreted code or a second interpreted code;
   a first test apparatus, configured to perform a first test on the DUT based on the source code when the processor interprets the source code to generate the first interpreted code, wherein the first test apparatus only executes the first interpreted code interpreted from the source code to perform the first test;
   a second test apparatus, configured to perform a second test on the DUT based on the source code when the processor interprets the source code to generate the second interpreted code, wherein the second test apparatus only executes the second interpreted code interpreted from the source code to perform the second test;
   wherein the source code is written in an interpreted language, and the first interpreted code is written in a first language, wherein the second interpreted code is written in a second language, wherein the first language is different from the second language,
   wherein the first interpreted code written in the first language is compiled by a first compiler of the first test apparatus and the second interpreted code written in the second language is compiled by a second compiler of the second test apparatus.

12. The semiconductor test system of claim 11, wherein the first test apparatus is further configured to compile the first interpreted code to generate a first machine code, and configured to execute the first machine code to perform the first test on the DUT.

13. The semiconductor test system of claim 11, wherein the first language is a first compiled language, and the second language is a second compiled language.

14. The semiconductor test system of claim 11, wherein the second test apparatus is further configured to compile the second interpreted code to generate a second machine code, and configured to execute the second machine code to perform the second test on the DUT.

15. The semiconductor test system of claim 14, wherein the first interpreted code and the second interpreted code have the same functions.

16. The semiconductor test system of claim 11, wherein
   the processor is further configured to update the first test and the second test by modifying the source code to generate an updated source code, and configured to interpret the updated source code to generate an updated first interpreted code, wherein the updated first interpreted code is written in the first language, and
   the first test apparatus is further configured to perform the first test on the DUT based on the updated first interpreted code.

17. The semiconductor test system of claim 16, wherein
   the processor is further configured to interpret the updated source code to generate an updated second interpreted code, wherein the updated second interpreted code is written in the second language, and
   the second test apparatus is further configured to perform the second test on the DUT based on the updated second interpreted code.

18. The semiconductor test system of claim 11, wherein the DUT is a dynamic random access memory (DRAM).

* * * * *